United States Patent
Izawa et al.

(10) Patent No.: US 11,782,299 B2
(45) Date of Patent: Oct. 10, 2023

(54) DISPLAY DEVICE

(71) Applicant: Japan Display Inc., Tokyo (JP)

(72) Inventors: Mao Izawa, Tokyo (JP); Masaaki Takuma, Tokyo (JP); Hisanori Kawakami, Tokyo (JP)

(73) Assignee: Japan Display Inc., Tokyo (JP)

( * ) Notice: Subject to any disclaimer, the term of this patent is extended or adjusted under 35 U.S.C. 154(b) by 16 days.

(21) Appl. No.: 17/555,681

(22) Filed: Dec. 20, 2021

(65) Prior Publication Data

US 2022/0113571 A1  Apr. 14, 2022

Related U.S. Application Data

(63) Continuation of application No. PCT/JP2020/020796, filed on May 26, 2020.

(30) Foreign Application Priority Data

Jun. 26, 2019  (JP) .................................. 2019-118587

(51) Int. Cl.
  *G02F 1/1333* (2006.01)
  *G02F 1/1335* (2006.01)
  *G02F 1/1339* (2006.01)

(52) U.S. Cl.
  CPC ...... *G02F 1/133305* (2013.01); *G02F 1/1339* (2013.01); *G02F 1/133308* (2013.01); *G02F 1/133528* (2013.01)

(58) Field of Classification Search
  None
  See application file for complete search history.

(56) References Cited

U.S. PATENT DOCUMENTS

| | | |
|---|---|---|
| 2013/0169515 A1 | 7/2013 | Prushinsky et al. |
| 2014/0340855 A1 | 11/2014 | Lee et al. |
| 2017/0062773 A1 | 3/2017 | Lee et al. |

(Continued)

FOREIGN PATENT DOCUMENTS

| | | |
|---|---|---|
| CN | 105448204 A | 3/2016 |
| JP | 2014-132319 A | 7/2014 |

(Continued)

OTHER PUBLICATIONS

Translation of Office Action issued in related Japanese Patent Application No. 2019-118587 dated Oct. 4, 2022. 4 pages.

(Continued)

*Primary Examiner* — Phu Vu
(74) *Attorney, Agent, or Firm* — K&L Gates LLP

(57) ABSTRACT

According to one embodiment, a display device includes a sheet-like display panel having a first area, second and third areas, and a support substrate bonded to the display panel. The support substrate has a first support portion overlapping the first area, second and third support portions overlapping the second area, fourth and fifth support portions overlapping the third area, a first groove between the first and second support portions, a second groove between the second and third support portions, a third groove between the first and fourth support portions, and a fourth groove between the fourth and fifth support portions. The first and second grooves extend along the second direction. The third and fourth grooves extend along a first direction.

13 Claims, 12 Drawing Sheets

(56) References Cited

U.S. PATENT DOCUMENTS

2018/0047938 A1     2/2018  Kishimoto et al.
2019/0101785 A1*    4/2019  Araki ................... H10K 59/131

FOREIGN PATENT DOCUMENTS

JP      2018-091913 A     6/2018
JP      2019-053205 A     4/2019

OTHER PUBLICATIONS

International Search Report issued in International Patent Application No. PCT/JP2020/020796 dated Aug. 11, 2020 and English translation of same. 7 pages.
Written Opinion issued in International Patent Application No. PCT/JP2020/020796 dated Aug. 11, 2020. 4 pages.

* cited by examiner

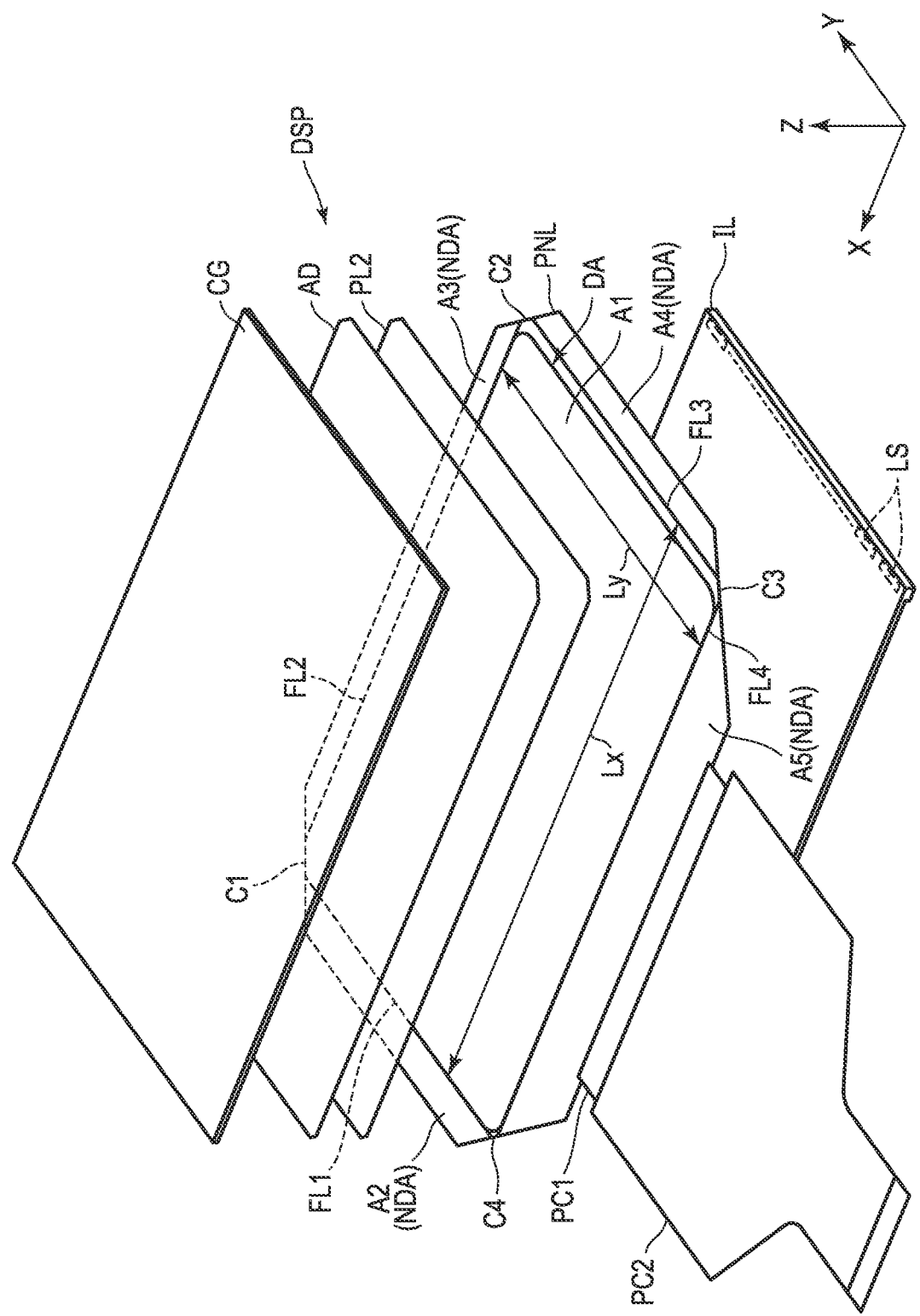
F I G. 1

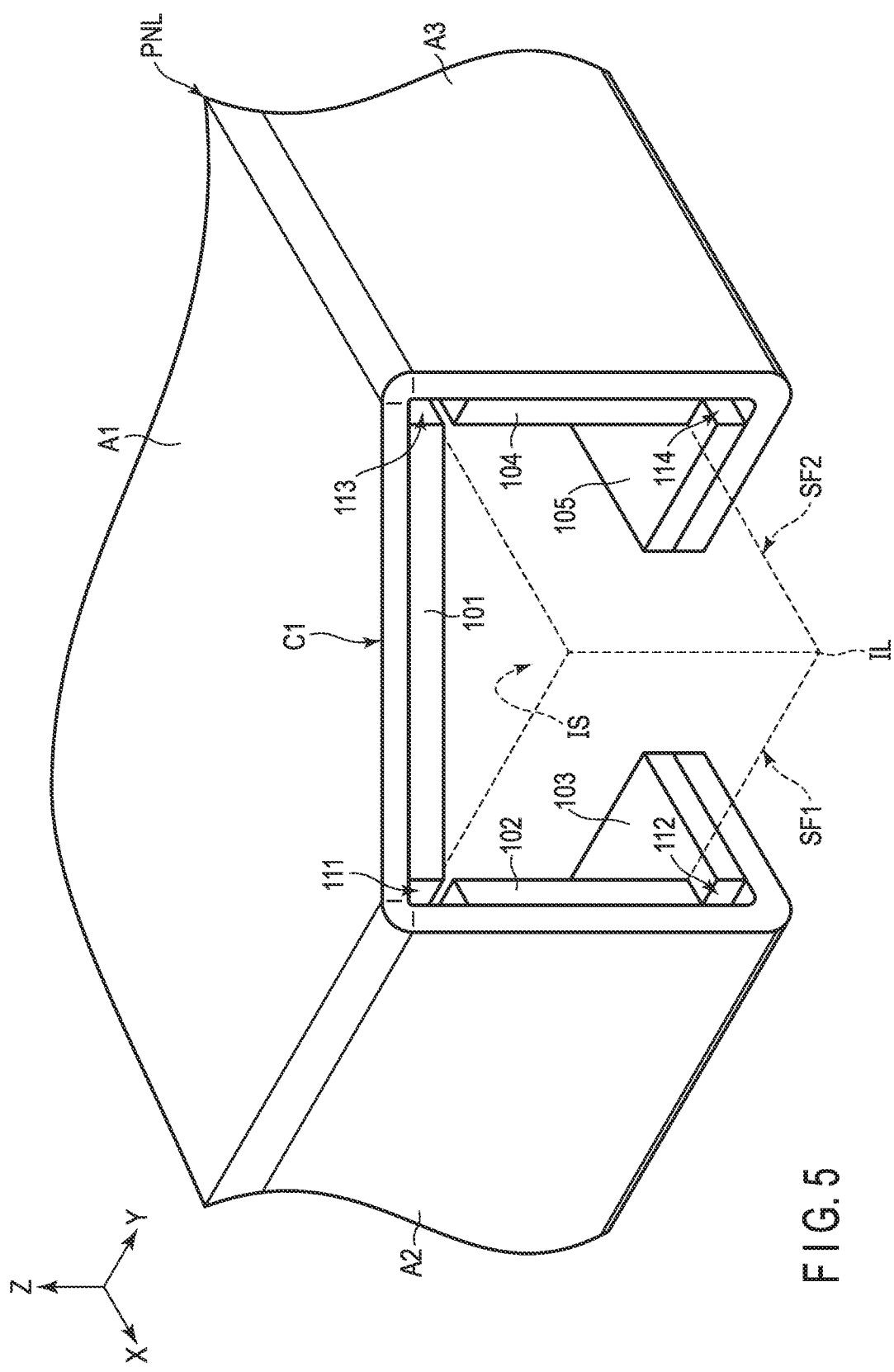
F I G. 5

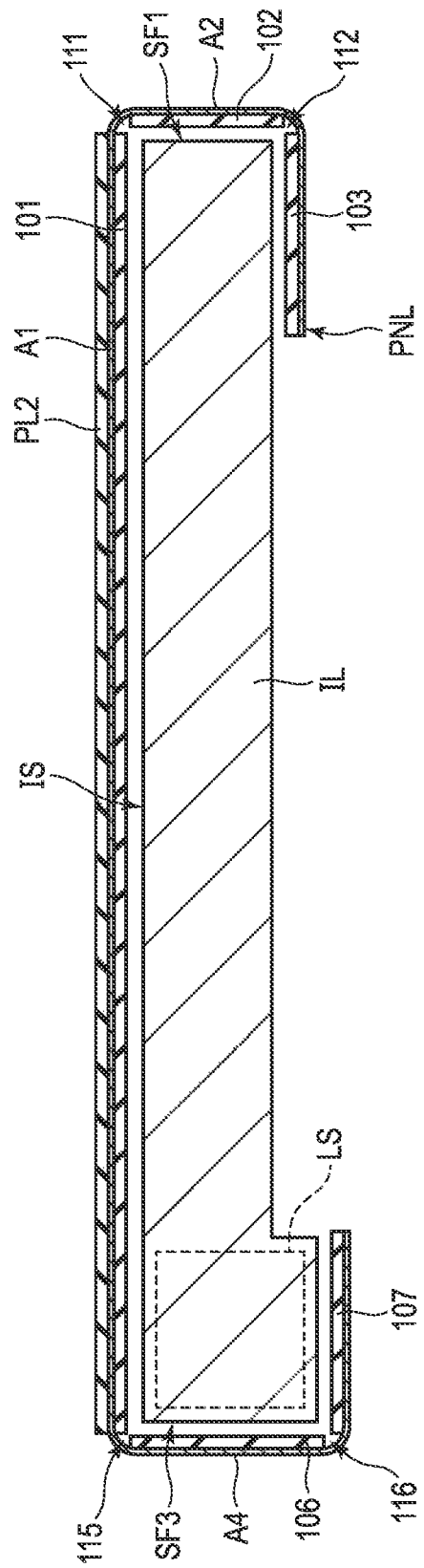
F I G. 6

DISPLAY DEVICE

CROSS-REFERENCE TO RELATED APPLICATIONS

This application is a Continuation Application of PCT Application No. PCT/JP2020/020796, filed May 26, 2020 and based upon and claiming the benefit of priority from Japanese Patent Application No. 2019-118587, filed Jun. 26, 2019, the entire contents of all of which are incorporated herein by reference.

FIELD

Embodiments described herein relate generally to a display device.

BACKGROUND

Recently, there has been an increasing demand to narrow the frame of a display device. As a technique for realizing a narrower frame, for example, such a technique is proposed that an area outside a display area of a flexible sheet-like display panel is folded.

BRIEF DESCRIPTION OF THE DRAWINGS

FIG. 1 is an exploded perspective view of a configuration example of a display device DSP according to the present embodiment.

FIG. 5 is a perspective view showing a state where the display panel PNL is folded in an area including a corner C1.

FIG. 6 is a cross-sectional view of the display device DSP along a first direction X.

DETAILED DESCRIPTION

Figure 2:
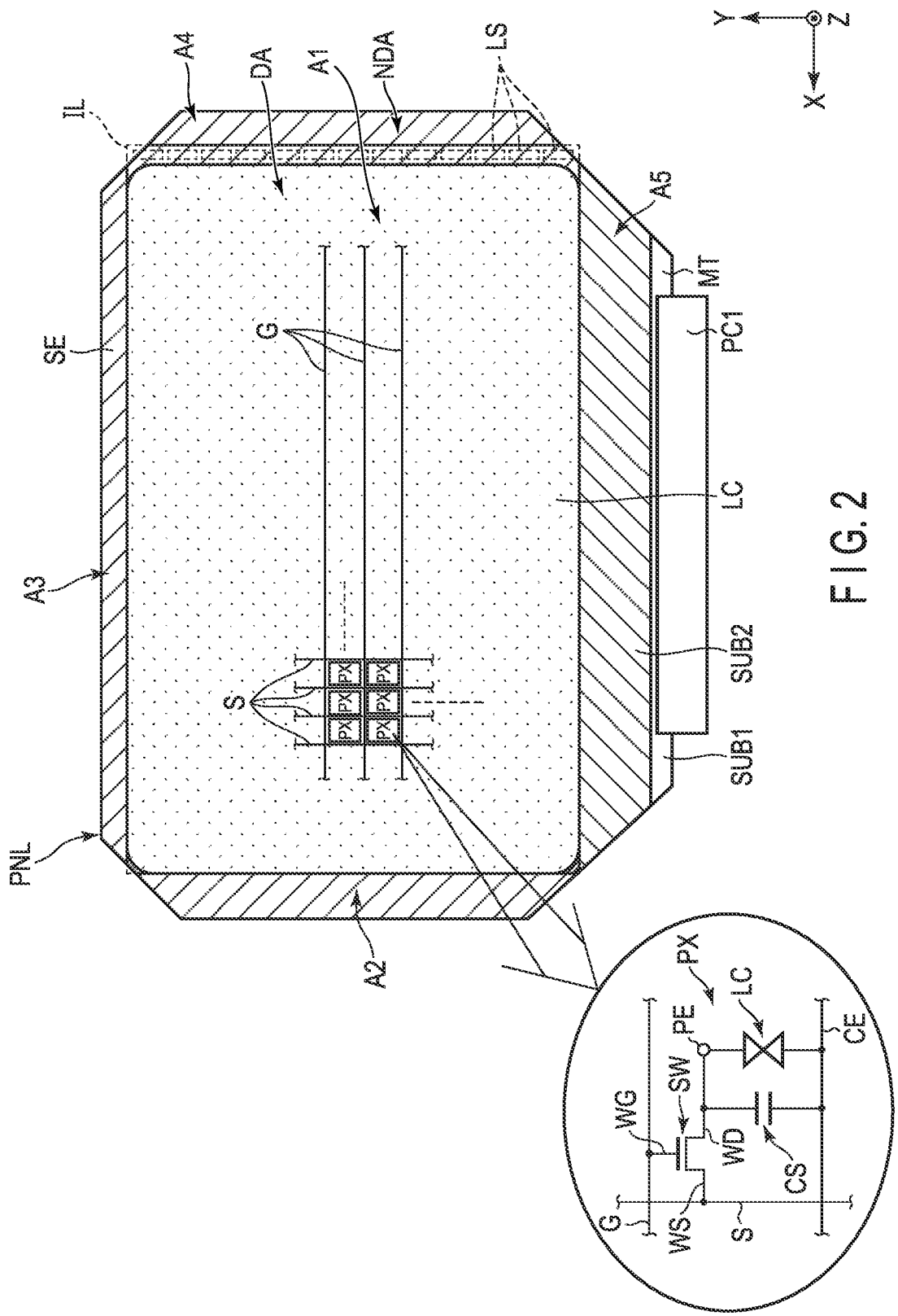
FIG. 2 is a plan view of a display panel PNL shown in FIG. 1 when viewed from a cover member CG side.

In general, according to one embodiment, there is provided a display device comprising a sheet-like display panel having a first area which includes a display area and a second area and a third area which are non-display areas, and a support substrate bonded to the display panel. The first area and the second area are adjacent to each other in a first direction. The first area and the third area are adjacent to each other in a second direction intersecting the first direction. The support substrate has a first support portion overlapping the first area, a second support portion and a third support portion overlapping the second area, a fourth support portion and a fifth support portion overlapping the third area, a first groove between the first support portion and the second support portion, a second groove between the second support portion and the third support portion, a third groove between the first support portion and the fourth support portion, and a fourth groove between the fourth support portion and the fifth support portion. The first groove and the second groove extend along the second direction. The third groove and the fourth groove extend along the first direction.

According to another embodiment, there is provided a display device comprising a sheet-like display panel having a first area which includes a display area and a second area which is a non-display area, and a support substrate bonded to the display panel. The first area and the second area are adjacent to each other. The support substrate has a first support portion overlapping the first area, a second support portion overlapping the second area, and a first groove between the first support portion and the second support portion. The support substrate is formed of a different material from a polarizer. The present embodiment will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed description thereof which is considered redundant is omitted unless necessary.

FIG. 1 is an exploded perspective view showing a configuration example of the display device DSP according to the present embodiment. A first direction X, a second direction Y and a third direction Z are orthogonal to each other in one example, but may intersect at an angle other than 90 degrees. The first direction X and the second direction Y correspond to directions parallel to the main surface of a substrate constituting the display device DSP, and the third direction Z corresponds to the thickness direction of the display device DSP. In the present embodiment, viewing an X-Y plane defined by the first direction X and the second direction Y is referred to as planar view.

In the present embodiment, the display device DSP is a liquid crystal display device having a liquid crystal element as a display element. However, the display device DSP may be a display device having a display element such as an organic electroluminescent (EL) element, an electrophoretic element or a micro-light-emitting diode.

The display device DSP comprises an illumination device IL, a foldable sheet-like display panel PNL, a polarizer PL2, a transparent adhesive AD, a transparent cover member CG, and wiring boards PC1 and PC2. Note that, although the display panel PNL is disposed between a polarizer PL1 and the polarizer PL2 in the third direction Z, illustration of the polarizer PL1 between the illumination device IL and the display panel PNL is omitted in FIG. 1.

The display panel PNL has a first area A1, a second area A2, a third area A3, a fourth area A4 and a fifth area A5. The first area A1 includes a display area DA. The first area A1 has a substantially rectangular shape, and in one example, the first area A1 has a rectangular shape long along the first direction X. Note that the first area A1 is not limited to a rectangular shape but may have another polygonal shape. The second area A2, the third area A3, the fourth area A4 and the fifth area A5 are non-display areas NDA. The second area A2 and the fourth area A4 extend along the second direction Y, and the third area A3 and the fifth area A5 extend along the first direction X.

The first area A1 and the second area A2 are adjacent to each other in the first direction X, and the first area A1 and the third area A3 are adjacent to each other in the second direction Y. Similarly, the fourth area A4 and the first area A1 are adjacent to each other in the first direction X, and the fifth area A5 and the first area A1 are adjacent to each other in the second direction Y.

The display panel PNL is foldable along at least two intersecting directions. In the example shown in FIG. 1, the display panel PNL is foldable along four fold lines FL1, FL2, FL3 and FL4. All the fold lines FL1 to FL4 are mountain fold lines. That is, the second area A2 to the fifth area A5 are folded from the first area A1 to the lower side (that is, the illumination device IL side) respectively on the fold lines FL1 to FL4.

The fold lines FL1, FL2, FL3 and FL4 correspond to four sides of the first area A1. The fold line FL1 is located between the first area A1 and the second area A2, the fold line FL2 is located between the first area A1 and the third area A3, the fold line FL3 is located between the first area A1 and the fourth area A4, and the fold line FL4 is located between the first area A1 and the fifth area A5. The fold lines FL1 and FL3 extend along the second direction Y, and the fold lines FL2 and FL4 extend along the first direction X.

Note that respective areas between the second area A2 and the third area A3, between the third area A3 and the fourth area A4, between the fourth area A4 and the fifth area A5 and between the area A5 and the second area A2 are removed, and the second area A2, the third area A3, the fourth area A4 and the fifth area A5 are separated from each other. In addition, four corners C1, C2, C3 and C4 of the first area A1 do not necessarily have a right angle but may be chamfered as shown in FIG. 1. In this case, the fold lines FL1, FL2, FL3 and FL4 do not intersect each other at the corners C1 to C4.

As shown in FIG. 1, a length Lx along the first direction X of the first area A1 is greater than the fold lines FL2 and FL4. In addition, a length Ly along the second direction Y of the first area A1 is greater than the fold lines FL1 and FL3. The length Lx corresponds to the distance between the fold line FL1 and the fold line FL3. The length Ly corresponds to the distance between the fold line FL2 and the fold line FL4.

The second area A2 is continuous with the first area A1 between the corner C1 and the corner C4. The third area A3 is continuous with the first area A1 between the corner C1 and the corner C2. The fourth area A4 is continuous with the first area A1 between the corner C2 and the corner C3. The fifth area A5 is continuous with the first area A1 between the corner C3 and the corner C4.

The wiring board PC1 is electrically connected to the display panel PNL in the fifth area A5. The wiring board PC1 is a foldable flexible wiring board. The wiring board PC2 is electrically connected to the wiring board PC1. The wiring board PC2 is a wiring board harder than the wiring board PC1 in one example, but may be a flexible wiring board.

Note that, although the present embodiment illustrates an example where two wiring boards PC1 and PC2 are disposed, one wiring board may be disposed instead of two wiring boards PC1 and PC2. In the case of one wiring board, a foldable flexible wiring board is disposed as the wiring board.

The illumination device IL overlaps the first area A1 of the display panel PNL in the third direction Z. The illumination device IL comprises a plurality of light sources LS shown by dotted lines. The light sources LS are arranged in the second direction Y, and emit light toward the first direction X.

The polarizer PL2 overlaps the first area A1 in the third direction Z, and is bonded to the display panel PNL. On the other hand, the polarizer PL2 does not overlap the second area A2, the third area A3, the fourth area A4 and the fifth area A5.

The cover member CG overlaps the first area A1 in the third direction Z. The cover member CG is bonded to the polarizer PL2 by the adhesive AD.

FIG. 2 is a plan view of the display panel PNL shown in FIG. 1 when viewed from the cover member CG side.

The display panel PNL comprises a first substrate SUB1, a second substrate SUB2 and a liquid crystal layer LC. The first substrate SUB1 and the second substrate SUB2 overlap each other in the third direction Z, and are bonded together by a sealant SE. The sealant SE surrounds the display area DA, and is disposed in the non-display areas NDA. In the example shown in FIG. 2, as shown by hatch lines, the sealant SE is disposed around the periphery of the first area A1, and is disposed over substantially the entire areas of the second area A2, the third area A3, the fourth area A4 and the fifth area A5. The liquid crystal layer LC is located inside an area surrounded by the sealant SE.

The first substrate SUB1 comprises a mounting portion MT which extends along the second direction Y from the second substrate SUB2 in planar view. In the example shown in FIG. 2, the mounting portion MT is located in the fifth area A5. The wiring board PC1 is mounted on the mounting portion MT.

The display panel PNL comprises a plurality of scanning lines G, a plurality of signal lines S and a plurality of pixels PX in the display area DA. Here, the pixels PX correspond to a minimum unit which is individually controllable according to a pixel signal. In the example shown in FIG. 2, the scanning lines G extend along the first direction X and are arranged at intervals in the second direction Y. The signal lines S extend along the second direction Y and are arranged at intervals in the first direction X. The pixels PX are arranged in a matrix along the first direction X and the second direction Y.

As shown on the lower side in FIG. 2, each pixel PX comprises a switching element SW, a pixel electrode PE, a common electrode CE, the liquid crystal layer LC (liquid crystal element) and the like. The switching element SW is composed of, for example, a thin-film transistor (TFT). The scanning line G is electrically connected to the switching element SW in each of the pixels PX arranged in the first direction X. The signal line S is electrically connected to the switching element SW in each of the pixels PX arranged in the second direction Y. The pixel electrode PE is electrically connected to the switching element SW. Each of the pixel electrodes PE is opposed to the common electrode CE arranged over the pixels PX, and drives the liquid crystal layer LC by an electric field generated between the pixel electrode PE and the common electrode CE. A storage capacitance CS is formed, for example, between an electrode having the same potential as the common electrode CE and an electrode having the same potential as the pixel electrode PE. The scanning lines G, the signal lines S, the switching elements SW and the pixel electrodes PE are disposed in the first substrate SUB1, for example. The common electrode CE may be disposed in the first substrate SUB1 or may be disposed in the second substrate SUB2.

The illumination device IL shown by a dotted line in FIG. 2 overlaps the first area A1 of the display panel PNL. In addition, the light sources LS overlap the non-display area NDA in the first area A1 (that is, an area between the display area DA and the fourth area A4).

Figure 3:
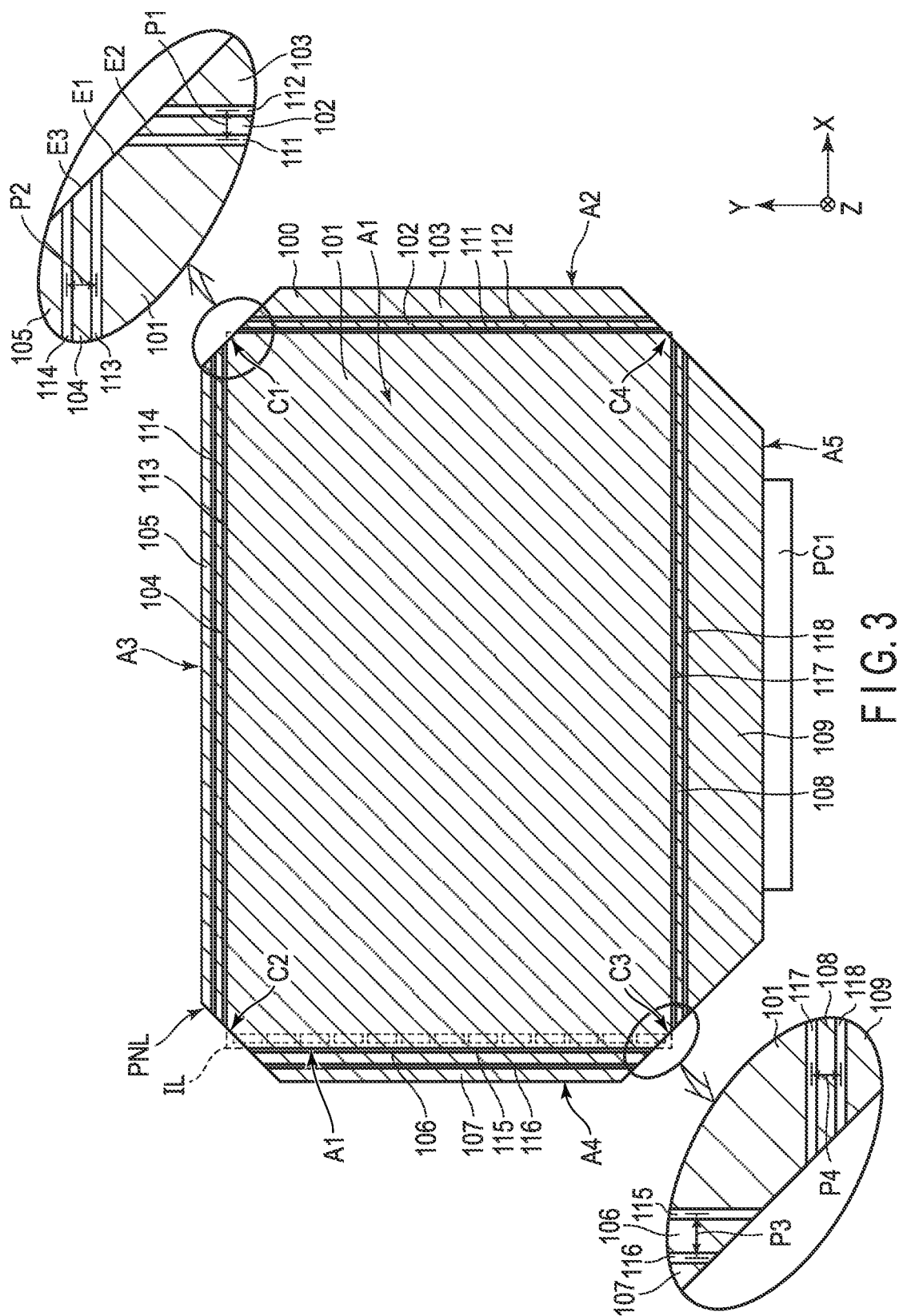
FIG. 3 is a plan view of the display panel PNL shown in FIG. 1 when viewed from an illumination device IL side.

FIG. 3 is a plan view of the display panel PNL shown in FIG. 1 when viewed from the illumination device IL side.

A support substrate 100 is bonded to the illumination device IL side of the display panel PNL (or the back side of the display panel PNL) as shown by hatch lines in FIG. 3. This support substrate 100 has a higher rigidity than the display panel PNL. The support substrate 100 is the polarizer PL1 disposed on the illumination device IL side of the display panel PNL in one example, but may be a resin film different from a polarizer.

The support substrate 100 has a first support portion 101, a second support portion 102, a third support portion 103, a fourth support portion 104, a fifth support portion 105, a sixth support portion 106, a seventh support portion 107, an eighth support portion 108 and a ninth support portion 109.

The first support portion 101 overlaps the first area A1. The second support portion 102 and the third support portion 103 overlap the second area A2. The fourth support portion 104 and the fifth support portion 105 overlap the third area A3. The sixth support portion 106 and the seventh support portion 107 overlap the fourth area A4. The eighth support portion 108 and the ninth support portion 109 overlap the fifth area A5.

In addition, the support substrate 100 has a first groove 111, a second groove 112, a third groove 113, a fourth groove 114, a fifth groove 115, a sixth groove 116, a seventh groove 117 and an eighth groove 118. The first groove 111 is located between the first support portion 101 and the second support portion 102, and the second groove 112 is located between the second support portion 102 and the third support portion 103. The third groove 113 is located between the first support portion 101 and the fourth support portion 104, and the fourth groove 114 is located between the forth support portion 104 and the fifth support portion 105. The fifth groove 115 is located between the first support portion 101 and the sixth support portion 106, and the sixth groove 116 is located between the sixth support portion 106 and the seventh support portion 107. The seventh groove 117 is located between the first support portion 101 and the eighth support portion 108, and the eighth groove 118 is located between the eighth support portion 108 and the ninth support portion 109.

When attention is focused on the support substrate 100 overlapping the first area A1 and the second area A2, the first support portion 101, the second support portion 102 and the third support portion 103 are arranged in the first direction X. The first groove 111 and the second groove 112 extend along the second direction Y. In one example, the first groove 111 and the second groove 112 are parallel to each other. Similarly, the fifth groove 115 and the sixth groove 116 extend along the second direction Y.

When attention is focused on the support substrate 100 overlapping the first area A1 and the third area A3, the first support portion 101, the fourth support portion 104 and the fifth support portion 105 are arranged in the second direction Y. The third groove 113 and the fourth groove 114 extend along the first direction X. In one example, the third groove 113 and the fourth groove 114 are parallel to each other. Similarly, the seventh groove 117 and the eighth groove 118 extend along the first direction X.

In the present embodiment, a configuration which splits the support substrate 100 is illustrated as the first groove 111 to the eighth groove 118. However, a slit which does not completely split the support substrate 100 but leaves the bottom surface of the support substrate 100 continuous may be the first groove 111 to the eighth groove 118.

When attention is focused on the corner C1, as shown enlarged in FIG. 3, the first area A1 has a first edge E1, the second area A2 has a second edge E2 continuous with the first edge E1, and the third area A3 has a third edge E3 continuous with the first edge E1. The first edge E1 is located between the second edge E2 and the third edge E3. The first edge E1, the second edge E2 and the third edge E3 extend in a direction different from the first direction X and the second direction Y (an oblique direction intersecting the first direction X and the second direction Y in the X-Y plane). The first edge E1, the second edge E2 and the third edge E3 extend on the same straight line in the example shown in FIG. 3 but are not limited to this example. The first groove 111 and the second groove 112 extend to the second edge E2. In addition, the third groove 113 and the fourth groove 114 extend to the third edge E3. Note that the description here focuses on the corner C1 but the other corners C2 to C4 are configured in the same manner as the corner C1.

In FIG. 3, the illumination device IL is shown by a dotted line for reference. The display panel PNL is folded along the first groove 111 to the eighth groove 118 such that the display panel PNL wraps the illumination device IL (a state where the display panel PNL wraps the illumination device IL will be described later). At the time, the first groove 111, the third groove 113, the fifth groove 115 and the seventh groove 117 overlap four ends of the illumination device IL. In addition, the first groove 111 overlaps the fold line FL1 shown in FIG. 1, the third groove 113 overlaps the fold line FL2, the fifth groove 115 overlaps the fold line FL3, and the seventh groove 117 overlaps the fold line FL4.

A pitch P1 between the first groove 111 and the second groove 112, a pitch P2 between the third groove 113 and the fourth groove 114, a pitch P3 between the fifth groove 115 and the sixth groove 116, a pitch P4 between the seventh groove 117 and the eighth groove 118 correspond to the thickness along the third direction Z of the illumination device IL. As shown in FIG. 2, the illumination device IL is thicker in a part where the light sources LS are disposed than in the other part. Therefore, the pitch P3 is greater than the pitch P1. Alternatively, the sixth support portion 106 is wider along the first direction X than the second support portion 102. The pitches P2 and P4 may be equal to the pitch P1 or may be equal to the pitch P3.

Note that the support substrate 100 may be configured such that the support substrate 100 comprises a support portion overlapping at least one area of the second area A2, the third area A3, the fourth area A4 and the fifth area A5 of the display panel PNL, and has at least one groove between this support portion and the first support portion 101.

Figure 4:
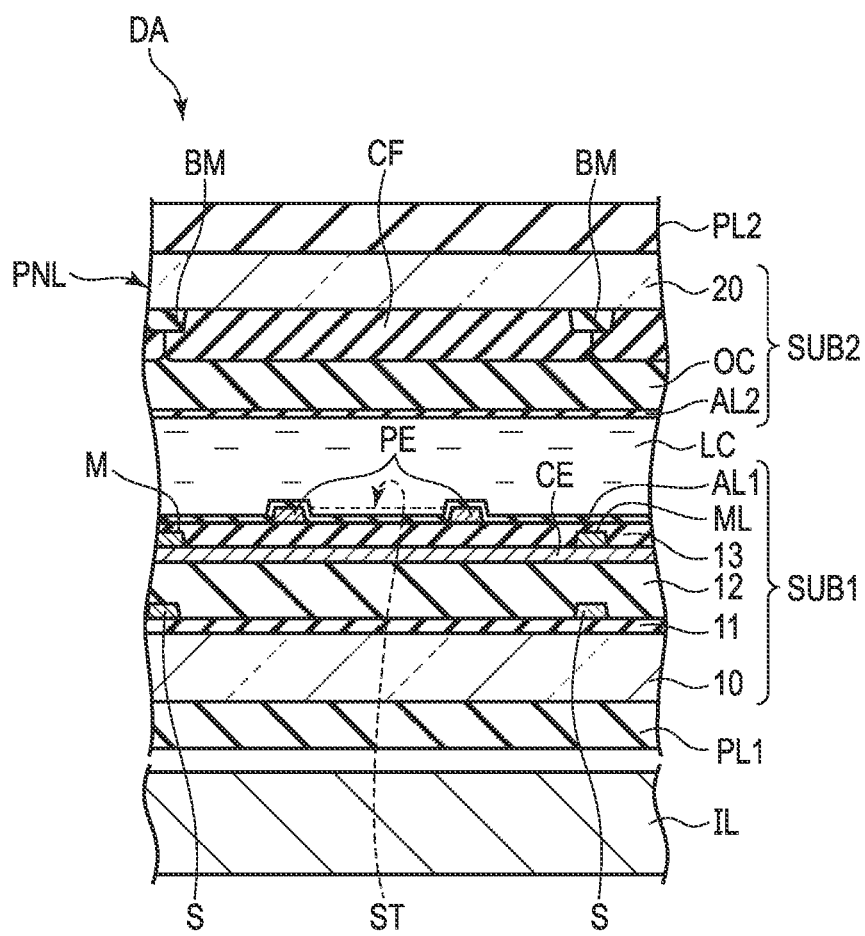
FIG. 4 is a cross-sectional view of a display area DA shown in FIG. 2.

FIG. 4 is a cross-sectional view of the display area DA shown in FIG. 2. The display panel PNL shown in FIG. 4 has a configuration corresponding to a display mode mainly using a lateral electric field substantially parallel to the main surface of a substrate. The main surface of the substrate here is a surface parallel to the X-Y plane.

The first substrate SUB1 comprises a first resin substrate 10, the signal lines S, the common electrode CE, a metal layer ML, the pixel electrodes PE, an insulating layer 11, an insulating layer 12, an insulating layer 13, a first alignment film AL1 and the like. Note that illustration of the switching elements and the scanning lines, various insulating layers interposed therebetween and the like is omitted.

The insulating layer 11 is disposed on the first resin substrate 10. The signal lines S are disposed on the insulating layer 11. The insulating layer 12 is disposed on the signal lines S and the insulating layer 11. The common electrode CE is disposed on the insulating layer 12. The metal layer ML is in contact with the common electrode CE directly above the signal lines S. The insulating layer 13 is disposed on the common electrode CE and the metal layer ML. The pixel electrodes PE are disposed on the insulating layer 13. The pixel electrodes PE are opposed to the common electrode CE via the insulating layer 13. In addition, the pixel electrodes PE each have a slit ST at a position opposed to the common electrode CE. The first alignment film AL covers the pixel electrodes PE and the insulating layer 13.

The second substrate SUB2 comprises a second resin substrate 20, a light-shielding layer BM, a color filter layer CF, an overcoat layer OC, a second alignment film AL2 and the like. The light-shielding layer BM and the color filter layer CF are disposed on a side of the second resin substrate 20 which is opposed to the first substrate SUB1. The color filter layer CF includes, for example, a red color filter, a green color filter, a blue color filter and the like. The overcoat layer OC covers the color filter layer CF. The second alignment film AL2 covers the overcoat layer OC.

In one example, the first resin substrate 10 and the second resin substrate 20 are flexible substrates having flexibility and formed of an organic insulating material such as polyimide. The common electrode CE and the pixel electrodes PE are formed of a transparent conductive material such as indium tin oxide (ITO) or indium zinc oxide (IZO). The insulating layer 11 and the insulating layer 13 are inorganic insulating layers, and the insulating layer 12 is an organic insulating layer.

The polarizer PL1 is bonded to the first resin substrate 10. The polarizer PL2 is bonded to the second resin substrate 20. Note that the polarizers PL1 and PL2 may include an optical member such as a retardation film as needed. For example, the polarizer PL1 corresponds to the support substrate 100 shown in FIG. 3, and is bonded over substantially the entire surface of the first resin substrate 10. That is, the polarizer PL1 is disposed not only in the first area A1 shown in FIG. 3 but also over the second area A2 to the fifth area A5. The polarizer PL2 is disposed in the first area A1 but is not disposed in the second area A2 to the fifth area A5.

Next, a state where the display panel PNL wraps the illumination device IL will be described.

FIG. 5 is a perspective view showing a state where the display panel PNL is folded in an area including the corner C1. In FIG. 5, the illumination device IL is shown by dotted lines.

The display panel PNL is folded along the first groove 111 to the fourth groove 114. In a state where the display panel PNL is folded, the first support portion 101 overlaps the third support portion 103 and the fifth support portion 105 in the third direction Z with the illumination device IL therebetween.

The illumination device IL has a first side surface SF1 opposed to the second support portion 102 in the first direction X, a second side surface SF2 opposed to the fourth support portion 104 in the second direction Y, and an illumination surface IS opposed to the first support portion 101 in the third direction Z. The light emitted from the light sources LS shown in FIG. 1 and the like is emitted from the illumination surface IS and illuminates the first area A1.

FIG. 6 is a cross-sectional view of the display device DSP along the first direction X.

The display panel PNL is folded along the first groove 111, the second groove 112, the fifth groove 115 and the sixth groove 116. In a state where the display panel PNL is folded, the first support portion 101 overlaps the third support portion 103 and the seventh support portion 107 in the third direction Z with the illumination device IL therebetween.

The illumination device IL has the light sources LS or a third side surface SF3 opposed to the sixth support portion 106 in the first direction X.

Note that, although the present embodiment illustrates what is called a side light type where the light sources LS are disposed on one side as the illumination device IL, the illumination device IL may be what is called a direct type where the light sources LS are disposed over the entire surface in the X-Y plane directly below the first area A1. In the case of a direct type illumination device, the cross section of the illumination device IL along the first direction X has a uniform thickness.

Figure 7:
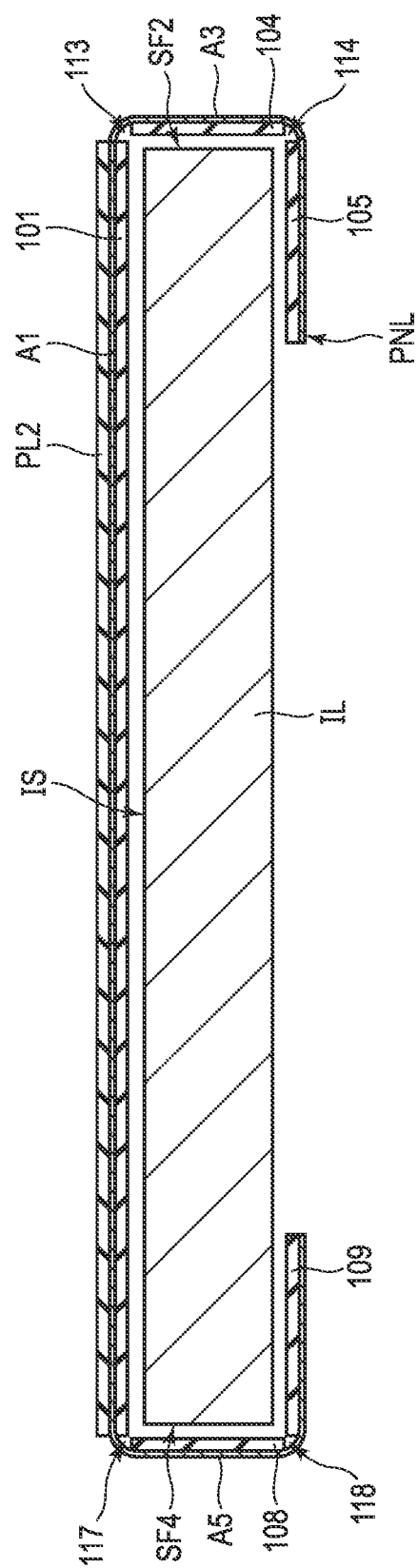
FIG. 7 is a cross-sectional view of the display device DSP along a second direction Y.

FIG. 7 is a cross-sectional view of the display device DSP along the second direction Y.

The display panel PNL is folded along the third groove 113, the fourth groove 114, the seventh groove 117 and the eighth groove 118. In a state where the display panel PNL is folded, the first support portion 101 overlaps the fifth support portion 105 and the ninth support portion 109 in the third direction Z with the illumination device IL therebetween.

The illumination device IL has a fourth side surface SF4 opposed to the eighth support portion 108 in the second direction Y.

Figure 8:
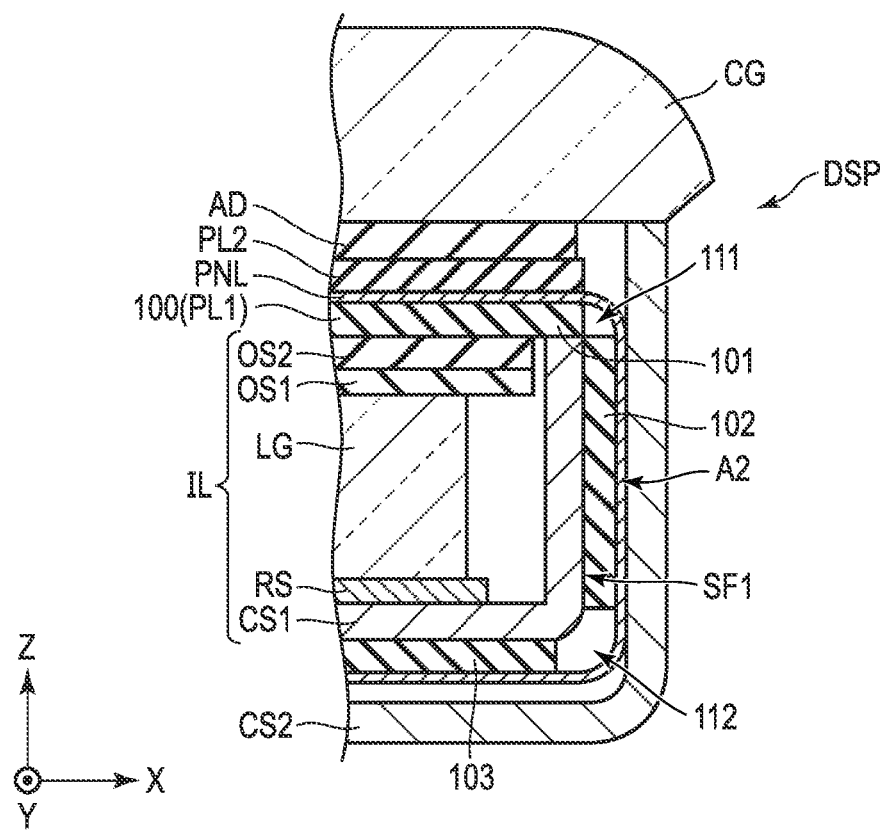
FIG. 8 is a cross-sectional view of the display device DSP close to a second area A2 shown in FIG. 6.

FIG. 8 is a cross-sectional view of the display device DSP close to the second area A2 shown in FIG. 6.

The illumination device IL comprises a light guide LG, a plurality of optical sheets OS1 and OS2, a reflective sheet RS, and a case CS1. The light guide LG, the optical sheets OS1 and OS2 and the reflective sheet RS are accommodated in the case CS1. The optical sheets OS1 and OS2 are disposed between the light guide LG and the support substrate 100 (or the polarizer PL1) in the third direction Z. The reflective sheet RS is disposed between the case CS1 and the light guide LG. The support substrate 100 and the display panel PNL are folded at a substantially right angle at the first groove 111 and the second groove 112 along the case CS1. The first side surface SF1 of the illumination device IL corresponds to a side surface of the case CS1. The other areas (the third area A3, the fourth area A4 and the fifth area A5) of the display panel PNL are also folded at a substantially right angle in the same manner as the second area A2.

The case CS2 accommodates the illumination device IL and the display panel PNL therein. The cover member CG is formed of, for example, a transparent glass substrate or a transparent resin substrate. The polarizer PL2 and the cover member CG are bonded together by the transparent adhesive AD.

According to the present embodiment, the display panel PNL with the support substrate 100 bonded thereto is foldable in at least two intersecting directions at the grooves formed in the support substrate 100. In addition, in the display panel PNL, the second area A2 to the fifth area A5 are folded close to the display area DA in the first area A1 so that the frame of the display device DSP is narrowed.

Furthermore, in areas where the display panel PNL is folded, the grooves are formed in the support substrate 100. Therefore, when the display panel PNL is folded, a stress on the display panel PNL can be moderated. In addition, the support portions of the support substrate 100 are disposed in the folded areas (the second area A1 to the fifth area A5) of the display panel PNL. Therefore, the curve (curve projecting away from the illumination device IL) of the folded areas is suppressed, and the display panel PNL can be folded at a substantially right angle along the outer shape of the illumination device IL. Consequently, the frame of the display device DSP can be further narrowed.

Certain examples will be described below. Each example will be described with reference to a cross section including the first area A1 and the second area A2 of the display panel PNL, and only main parts of the display panel PNL are illustrated and the details of the illumination device IL are not illustrated. In the drawing for explaining each example, A shows the display panel PNL before folded, and B shows the display panel PNL after folded along the illumination device IL.

First Example

Figure 9A:
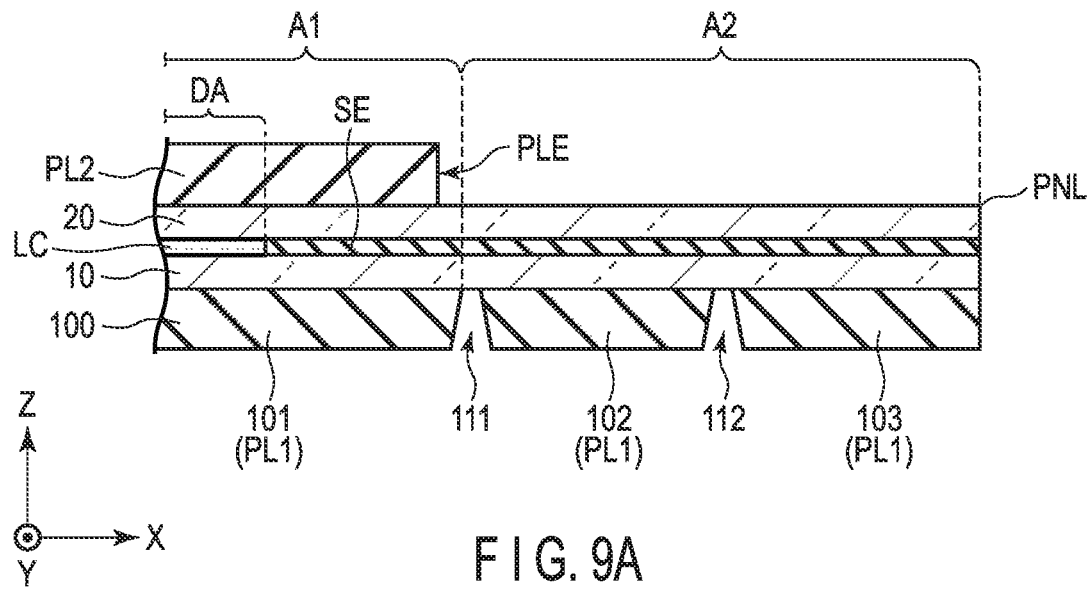
FIG. 9A is a cross-sectional view showing the first example.
Figure 9B:
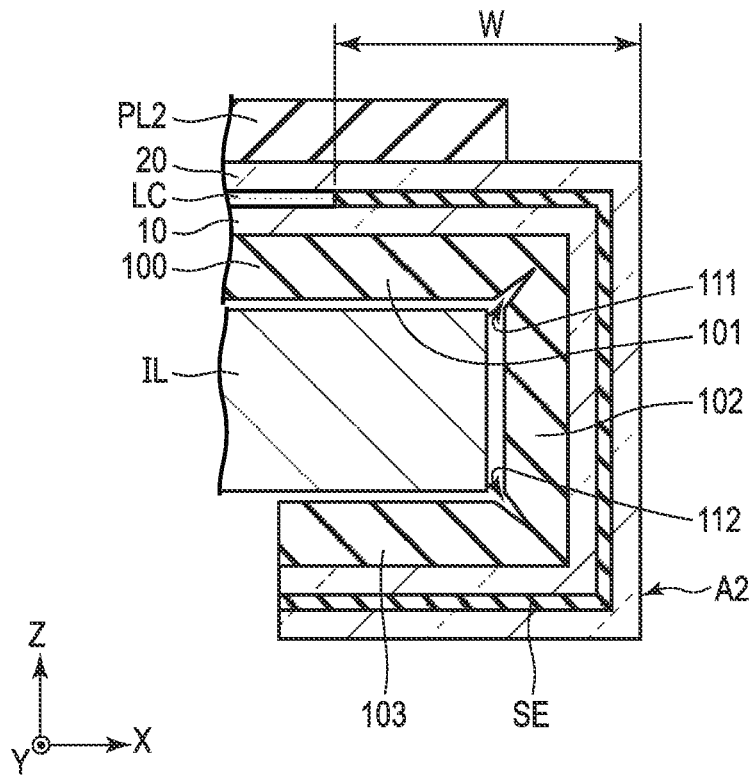
FIG. 9B is a cross-sectional view showing the first example.

FIGS. 9A and 9B are cross-sectional views showing the first example.

As shown in FIG. 9A, in the display panel PNL, the liquid crystal layer LC is disposed between the first resin substrate 10 and the second resin substrate 20, and is sealed in by the sealant SE in the first area A1. The liquid crystal layer LC is not disposed in the second area A2. The first resin substrate 10 and the second resin substrate 20 are disposed over the first area A1 and the second area A2. The sealant SE is disposed around the periphery of the first area A1, and is disposed over the entire area of the second area A2.

The support substrate 100 is bonded to the first resin substrate 10 over the first area A1 and the second area A2. The first groove 111 and the second groove 112 overlap the sealant SE in the third direction Z. The first groove 111 and the second groove 112 penetrate the support substrate 100 in one example but may not penetrate the support substrate 100. These first groove 111 and second groove 112 are formed by, for example, bonding the support substrate 100 to the first resin substrate 10 and irradiating it with laser light. In the support substrate 100, the first support portion 101, the second support portion 102 and the third support portion 103 are formed of the same material and all are the polarizer PL1.

The polarizer PL2 is bonded to the second resin substrate 20 in the first area A1. The polarizer PL2 is not disposed in the second area A2. An end PLE of the polarizer PL2 is located between the display area DA and the first groove 111 in the first direction X.

As shown in FIG. 9B, the folded second area A2 is maintained flat by the second support portion 102, and is thereby prevented from being curved away from the illumination device IL. Therefore, a frame width W is reduced as compared with when the second area A2 is curved.

Second Example

Figure 10A:
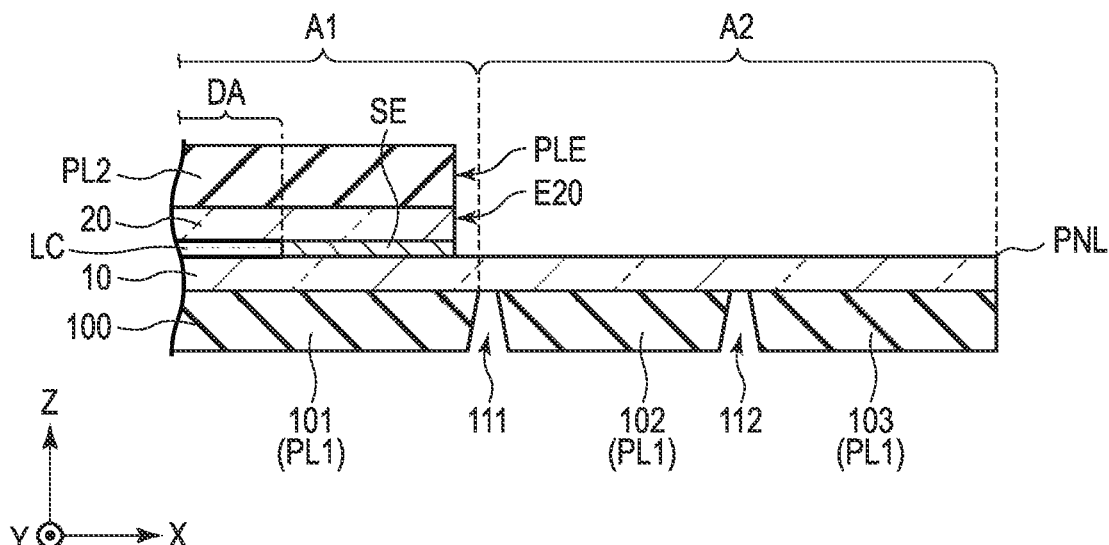
FIG. 10A is a cross-sectional view showing the second example.
Figure 10B:
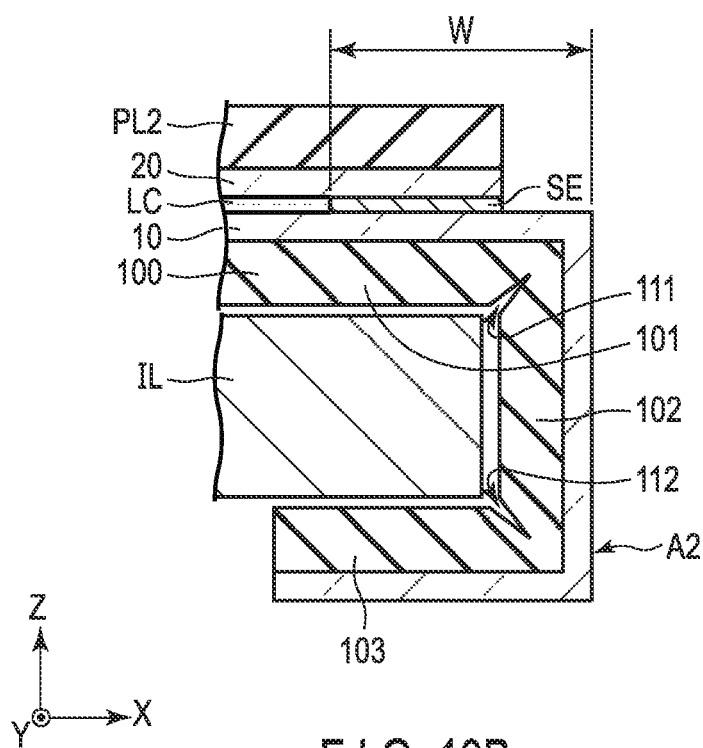
FIG. 10B is a cross-sectional view showing the second example.

FIGS. 10A and 10B are cross-sectional views showing the second example. The second example is different from the first example in that the second resin substrate 20 is not disposed in the second area A2.

That is, as shown in FIG. 10A, the first resin substrate 10 is disposed over the first area A1 and the second area A2. On the other hand, the second resin substrate 20 is disposed in the first area A1. An end E20 of the second resin substrate 20 is located between the display area DA and the first groove 111 in the first direction X. In one example, the end E20 overlaps the end PLE of the polarizer PL2 in the third direction Z. The sealant SE is disposed around the periphery of the first area A1 but is not disposed in the second area A2.

Regarding the support substrate 100, the first groove 111 and the second groove 112 overlap the first resin substrate 10 in the third direction Z but do not overlap the sealant SE and the second resin substrate 20.

As shown in FIG. 10B, the sealant SE and the second resin substrate 20 are not disposed in the folded second area A2. Therefore, the display panel PNL can be folded easily as compared with the first example. In addition, the frame width W is further reduced as compared with the first example.

Third Example

Figure 11A:
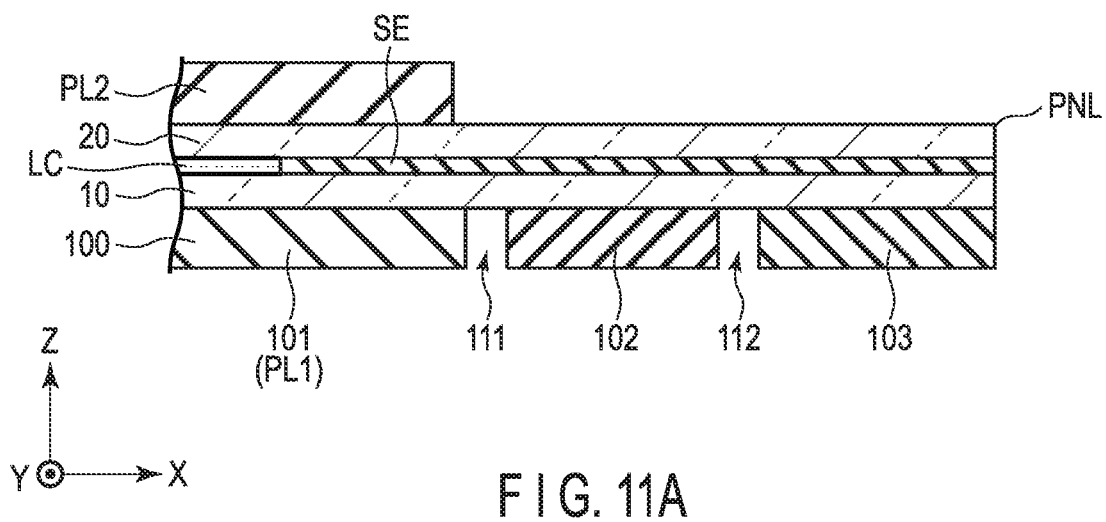
FIG. 11A is a cross-sectional view showing the third example.
Figure 11B:
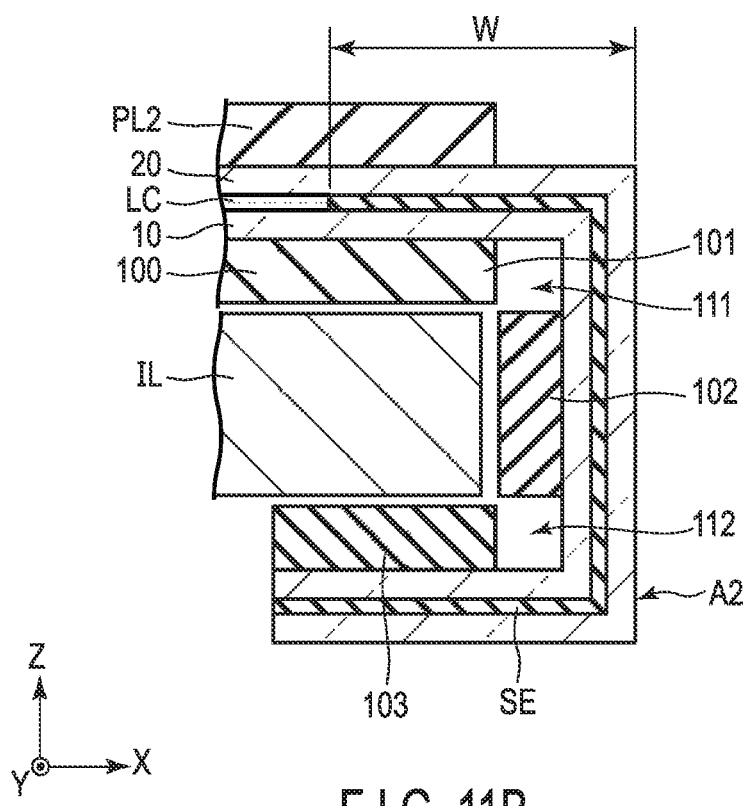
FIG. 11B is a cross-sectional view showing the third example.

FIGS. 11A and 11B are cross-sectional views showing the third example. The third example is different from the first example in that the second support portion 102 and the third support portion 103 in the support substrate 100 each are formed of a different material from the first support portion 101.

That is, as shown in FIG. 11A, regarding the support substrate 100, the first support portion 101 is the polarizer PL1 as is the case in the first example. The second support portion 102 and the third support portion 103 are films different from the polarizer PL1. In addition, the second support portion 102 and the third support portion 103 may be formed of different materials or may be formed of the same material. The second support portion 102 and the third support portion 103 have a higher rigidity than the display panel PNL.

In this support substrate 100, the first groove 111 and the second groove 112 penetrate the support substrate 100. For example, the first support portion (polarizer PL1) 101, the second support portion 102 and the third support portion 103 are bonded to the first resin substrate 10 such that the first support portion 101, the second support portion 102 and the third support portion 103 are spaced apart from each other. Accordingly, the first groove 111 is formed between the first support portion 101 and the second support portion 102, and the second groove 112 is formed between the second support portion 102 and the third support portion 103. Note that the second groove 112 may be formed by bonding a film to the first resin substrate 10 with a space from the polarizer PL1 and irradiating the film with laser light.

As shown in FIG. 11B, the folded second area A2 is maintained flat by the second support portion 102 which is a film different from the polarizer PL1. Therefore, as is the case in the first example, the frame width W is reduced as compared with when the second area A2 is curved.

Fourth Example

Figure 12A:
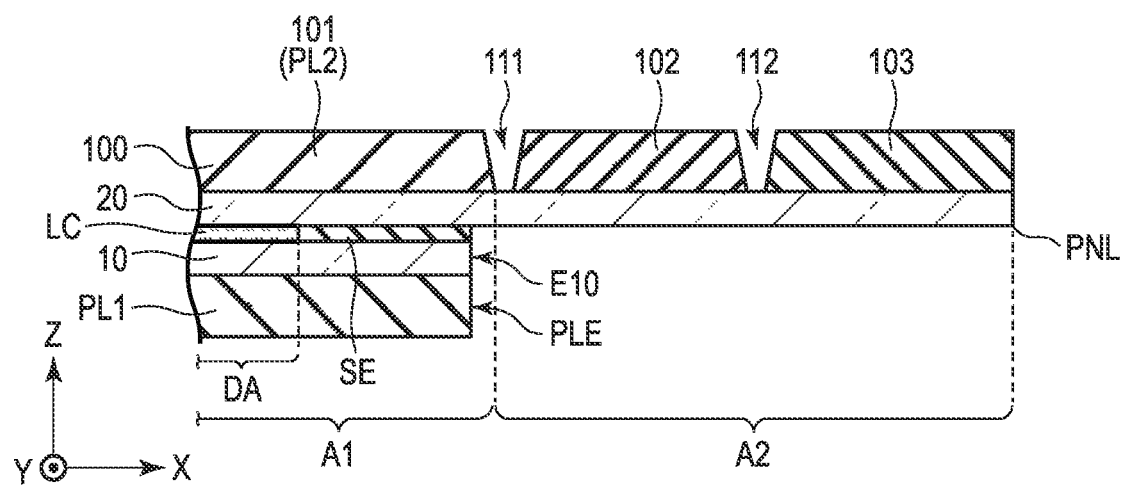
FIG. 12A is a cross-sectional view showing the fourth example.
Figure 12B:
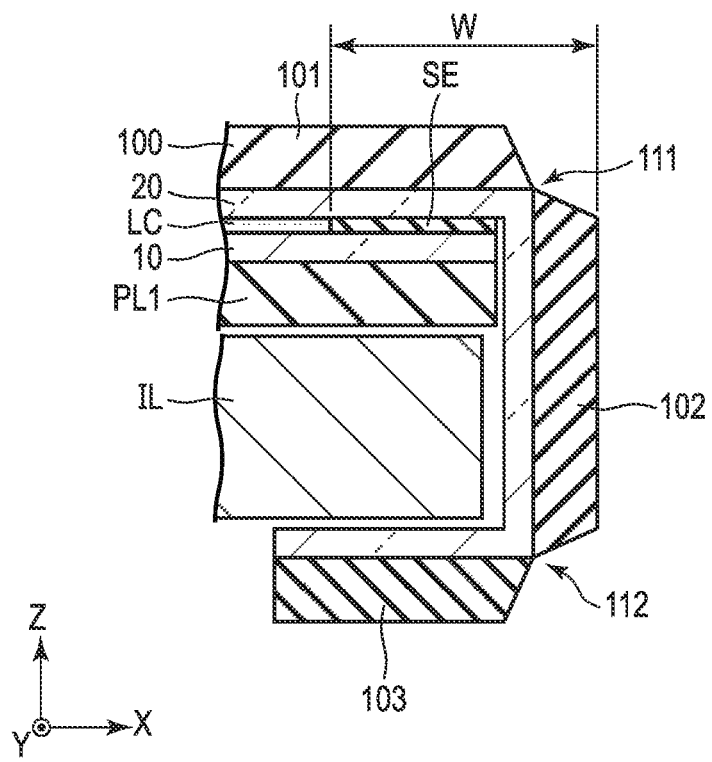
FIG. 12B is a cross-sectional view showing the fourth example.

FIGS. 12A and 12B are cross-sectional views showing the fourth example. The fourth example corresponds to an example where the support substrate 100 is bonded to the second resin substrate 20.

That is, as shown in FIG. 12A, the first resin substrate 10 is disposed in the first area A1. The second resin substrate 20 is disposed over the first area A1 and the second area A2. An end E10 of the first resin substrate 10 is located between the display area DA and the first groove 111 in the first direction X. In one example, the end E10 overlaps the end PLE of the polarizer PL1 in the third direction Z. The sealant SE is disposed around the periphery of the first area A1 but is not disposed in the second area A2.

The support substrate 100 is bonded to the second resin substrate 20 over the first area A1 and the second area A2. The first groove 111 and the second groove 112 overlap the first resin substrate 10 in the third direction Z but do not overlap the sealant SE and the second resin substrate 20. In the support substrate 100, at least the first support portion 101 is the polarizer PL2.

The second support portion 102 and the third support portion 103 may be the polarizer PL2 formed of the same material as the first support portion 101 or may be films formed of a different material from the first support portion 101.

As shown in FIG. 12B, the sealant SE and the second resin substrate 20 are not disposed in the folded second area A2. Therefore, the same effect as the second example can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

An example of the display device obtained from the configuration disclosed in the specification will be additionally described below.

(1)

A display device comprising:
a sheet-like display panel having a first area including a display area, and a second area and a third area being non-display areas; and
a support substrate bonded to the display panel, wherein
the first area and the second area are adjacent to each other in a first direction,
the first area and the third area are adjacent to each other in a second direction intersecting the first direction,
the support substrate has a first support portion overlapping the first area, a second support portion and a third support portion overlapping the second area, a fourth support portion and a fifth support portion overlapping the third area, a first groove between the first support portion and the second support portion, a second groove between the second support portion and the third support portion, a third groove between the first support portion and the fourth support portion, and a fourth groove between the fourth support portion and the fifth support portion,
the first groove and the second groove extend along the second direction, and
the third groove and the fourth groove extend along the first direction.

(2)

The display device of item (1), wherein the first support portion is a polarizer.

(3)

The display device of any one of items (1) and (2), wherein the second support portion and the third support portion are formed of a same material as the first support portion.

(4)

The display device of any one of items (1) and (2), wherein the second support portion and the third support portion each are formed of a different material from the first support portion.

(5)

The display device of item (1), wherein the display panel comprises a first resin substrate, a second resin substrate, a liquid crystal layer disposed between the first resin substrate and the second resin substrate, and a sealant sealing in the liquid crystal layer in the first area.

(6)

The display device of item (5), wherein
the first resin substrate and the second resin substrate are disposed over the first area and the second area,
the sealant is disposed around a periphery of the first area, and is disposed in the second area,
the support substrate is bonded to the first resin substrate, and
the first groove and the second groove overlap the sealant.

(7)

The display device of item (5), wherein
the first resin substrate is disposed over the first area and the second area,
the second resin substrate is disposed in the first area,
the sealant is disposed around a periphery of the first area,
the support substrate is bonded to the first resin substrate, and
an end of the second resin substrate is located between the display area and the first groove.

(8)

The display device of item (5), wherein
the first resin substrate is disposed in the first area,
the second resin substrate is disposed over the first area and the second area,
the sealant is disposed around a periphery of the first area,
the support substrate is bonded to the second resin substrate, and
an end of the first resin substrate is located between the display area and the first groove.

(9)

The display device of any one of items (1) to (8), further comprising an illumination device overlapping the first area, wherein
the display panel is folded along the first to fourth grooves,
the first support portion overlaps the third support portion and the fifth support portion with the illumination device therebetween, and
the illumination device has a first side surface opposed to the second support portion in the first direction, and a second side surface opposed to the fourth support portion in the second direction.

(10)

The display device of item (9), wherein a pitch between the first groove and the second groove and a pitch between the third groove and the fourth groove each correspond to a thickness of the illumination device.

(11)

The display device of any one of items (1) to (10), wherein
the first area has a first edge, the second area has a second edge continuous with the first edge,
the third area has a third edge continuous with the first edge, and
the first to third edges extend in a direction different from the first direction and the second direction.

(12)
The display device of item (11), wherein the first to third edges extend on a same straight line.

(13)
The display device of any one of items (11) and (12), wherein
the first groove and the second groove extend to the second edge, and
the third groove and the fourth groove extend to the third edge.

(14)
The display device of item (1), wherein p1 the display panel has a fourth area being a non-display area,
the first area and the fourth area are adjacent to each other in the first direction,
the first area is located between the second area and the fourth area,
the support substrate has a sixth support portion and a seventh support portion overlapping the fourth area, a fifth groove between the first support portion and the sixth support portion, and a sixth groove between the sixth support portion and the seventh support portion,
the fifth groove and the sixth groove extend along the second direction, and
a pitch between the fifth groove and the sixth groove is greater than a pitch between the first groove and the second groove.

(15)
The display device of item (14), further comprising an illumination device overlapping the first area, wherein
the display panel is folded along the first to sixth grooves,
the first support portion overlaps the seventh support portion with the illumination device therebetween, and
the illumination device comprises a light source opposed to the sixth support portion in the first direction.

What is claimed is:
1. A display device comprising:
a sheet-like display panel having a first area including a display area, and a second area and a third area being non-display areas; and
a support substrate bonded to the display panel, wherein
the first area and the second area are adjacent to each other in a first direction,
the first area and the third area are adjacent to each other in a second direction intersecting the first direction,
the support substrate has a first support portion overlapping the first area, a second support portion and a third support portion overlapping the second area, a fourth support portion and a fifth support portion overlapping the third area, a first groove between the first support portion and the second support portion, a second groove between the second support portion and the third support portion, a third groove between the first support portion and the fourth support portion, and a fourth groove between the fourth support portion and the fifth support portion,
the first groove and the second groove extend along the second direction,
the third groove and the fourth groove extend along the first direction, and
the second support portion and the third support portion each are formed of a different material from the first support portion.

2. The display device of claim 1, wherein the first support portion is a polarizer.

3. The display device of claim 1, wherein the display panel comprises a first resin substrate, a second resin substrate, a liquid crystal layer disposed between the first resin substrate and the second resin substrate, and a sealant sealing in the liquid crystal layer in the first area.

4. A display device comprising:
a sheet-like display panel having a first area including a display area, and a second area and a third area being non-display areas; and
a support substrate bonded to the display panel, wherein
the first area and the second area are adjacent to each other in a first direction,
the first area and the third area are adjacent to each other in a second direction intersecting the first direction,
the support substrate has a first support portion overlapping the first area, a second support portion and a third support portion overlapping the second area, a fourth support portion and a fifth support portion overlapping the third area, a first groove between the first support portion and the second support portion, a second groove between the second support portion and the third support portion, a third groove between the first support portion and the fourth support portion, and a fourth groove between the fourth support portion and the fifth support portion,
the first groove and the second groove extend along the second direction,
the third groove and the fourth groove extend along the first direction,
the display panel comprises a first resin substrate, a second resin substrate, a liquid crystal layer disposed between the first resin substrate and the second resin substrate, and a sealant sealing in the liquid crystal layer in the first area,
the first resin substrate and the second resin substrate are disposed over the first area and the second area,
the sealant is disposed around a periphery of the first area, and is disposed in the second area,
the support substrate is bonded to the first resin substrate, and
the first groove and the second groove overlap the sealant.

5. A display device comprising:
a sheet-like display panel having a first area including a display area, and a second area and a third area being non-display areas; and
a support substrate bonded to the display panel, wherein
the first area and the second area are adjacent to each other in a first direction,
the first area and the third area are adjacent to each other in a second direction intersecting the first direction,
the support substrate has a first support portion overlapping the first area, a second support portion and a third support portion overlapping the second area, a fourth support portion and a fifth support portion overlapping the third area, a first groove between the first support portion and the second support portion, a second groove between the second support portion and the third support portion, a third groove between the first support portion and the fourth support portion, and a fourth groove between the fourth support portion and the fifth support portion, the first groove and the second groove extend along the second direction, the third groove and the fourth groove extend along the first direction, the display panel comprises a first resin substrate, a second resin substrate, a liquid crystal layer disposed between the first resin substrate and the second resin substrate, and a sealant sealing in the liquid crystal layer in the first area, the first resin substrate is disposed over the first area and the second area, the second resin substrate is disposed in the first area, the sealant is disposed around a periphery of the first area, the support substrate is bonded to the first resin substrate, and an end of the second resin substrate is located between the display area and the first groove.

6. A display device comprising:

a sheet-like display panel having a first area including a display area, and a second area and a third area being non-display areas; and a support substrate bonded to the display panel, wherein the first area and the second area are adjacent to each other in a first direction, the first area and the third area are adjacent to each other in a second direction intersecting the first direction, the support substrate has a first support portion overlapping the first area, a second support portion and a third support portion overlapping the second area, a fourth support portion and a fifth support portion overlapping the third area, a first groove between the first support portion and the second support portion, a second groove between the second support portion and the third support portion, a third groove between the first support portion and the fourth support portion, and a fourth groove between the fourth support portion and the fifth support portion, the first groove and the second groove extend along the second direction, the third groove and the fourth groove extend along the first direction, the display panel comprises a first resin substrate, a second resin substrate, a liquid crystal layer disposed between the first resin substrate and the second resin substrate, and a sealant sealing in the liquid crystal layer in the first area, the first resin substrate is disposed in the first area, the second resin substrate is disposed over the first area and the second area, the sealant is disposed around a periphery of the first area, the support substrate is bonded to the second resin substrate, and an end of the first resin substrate is located between the display area and the first groove.

7. The display device of claim 1, further comprising an illumination device overlapping the first area, wherein the display panel is folded along the first to fourth grooves, the first support portion overlaps the third support portion and the fifth support portion with the illumination device therebetween, and the illumination device has a first side surface opposed to the second support portion in the first direction, and a second side surface opposed to the fourth support portion in the second direction.

8. The display device of claim 7, wherein a pitch between the first groove and the second groove and a pitch between the third groove and the fourth groove each correspond to a thickness of the illumination device.

9. The display device of claim 1, wherein the first area has a first edge, the second area has a second edge continuous with the first edge, the third area has a third edge continuous with the first edge, and the first to third edges extend in a direction different from the first direction and the second direction.

10. The display device of claim 9, wherein the first to third edges extend on a same straight line.

11. The display device of claim 9, wherein the first groove and the second groove extend to the second edge, and the third groove and the fourth groove extend to the third edge.

12. A display device comprising:

a sheet-like display panel having a first area including a display area, and a second area and a third area being non-display areas; and a support substrate bonded to the display panel, wherein the first area and the second area are adjacent to each other in a first direction, the first area and the third area are adjacent to each other in a second direction intersecting the first direction, the support substrate has a first support portion overlapping the first area, a second support portion and a third support portion overlapping the second area, a fourth support portion and a fifth support portion overlapping the third area, a first groove between the first support portion and the second support portion, a second groove between the second support portion and the third support portion, a third groove between the first support portion and the fourth support portion, and a fourth groove between the fourth support portion and the fifth support portion, the first groove and the second groove extend along the second direction, the third groove and the fourth groove extend along the first direction, the display panel has a fourth area being a non-display area, the first area and the fourth area are adjacent to each other in the first direction, the first area is located between the second area and the fourth area, the support substrate has a sixth support portion and a seventh support portion overlapping the fourth area, a fifth groove between the first support portion and the sixth support portion, and a sixth groove between the sixth support portion and the seventh support portion, the fifth groove and the sixth groove extend along the second direction, and a pitch between the fifth groove and the sixth groove is greater than a pitch between the first groove and the second groove.

13. The display device of claim 12, further comprising an illumination device overlapping the first area, wherein the display panel is folded along the first to sixth grooves, the first support portion overlaps the seventh support portion with the illumination device therebetween, and the illumination device comprises a light source opposed to the sixth support portion in the first direction.

* * * * *